July 15, 1958
S. P. HELD
2,843,735
REFLEX AMPLIFIER WITH TWO STAGES CASCADED AT INTERMEDIATE FREQUENCIES AND PARALLELED AT AUDIO FREQUENCIES
Filed Oct. 3, 1957
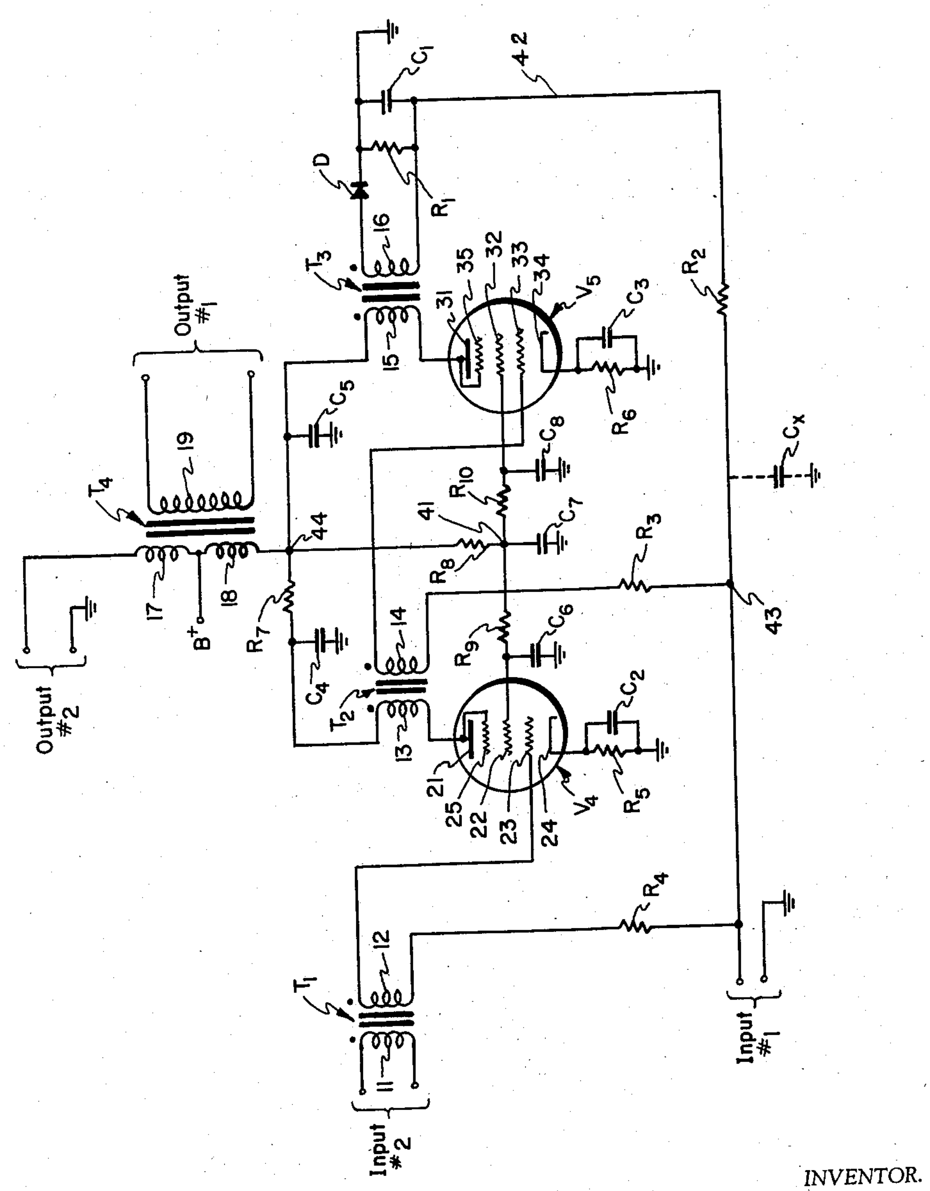
INVENTOR.
Sidney P. Held
BY
Gene W. Arant
ATTORNEY United States Patent Office 2,843,735

Patented July 15, 1958

2,843,735

REFLEX AMPLIFIER WITH TWO STAGES CASCADED AT INTERMEDIATE FREQUENCIES AND PARALLELED AT AUDIO FREQUENCIES

Sidney P. Held, Manhattan Beach, Calif.

Application October 3, 1957, Serial No. 687,908

5 Claims. (Cl. 250—20)

The present invention relates to an amplifier including a pair of vacuum tubes which operate in series and also in parallel, both at the same time.

In certain commercial applications of radio it is desired not only to achieve good quality of circuit performance but also to minimize the size, weight and cost of the circuitry. This is particularly true, for example, in the case of a two-way radio designed for aircraft usage where it is strongly desired to keep size, weight and cost to a minimum and where the comparative ease of transmission and reception does not impose exceptional performance demands upon the equipment.

The present invention provides a novel amplifier circuit which is particularly well adapted for the above application. When messages are to be transmitted from the aircraft, the novel circuit of the present invention acts as an audio amplifier, receiving an audio signal from a source such as a microphone circuit and providing sufficient amplification thereof so as to modulate the radio frequency power amplifier from which the modulated carrier wave is in turn supplied to the antenna. When messages are to be received, on the other hand, the novel circuit of the present invention receives the modulated intermediate frequency carrier wave (which has previously been derived from the radio frequency carrier by means of a conventional local oscillator and mixer arrangement), amplifies the I. F. carrier, and after rectification of the I. F. carrier to detect the audio signal therefrom, amplifies the audio signal sufficiently to drive a suitable output circuit such as a pair of head phones. The novel circuit of the present invention also includes a unique arrangement for providing automatic volume control.

One type of reflex amplifier which is well-known in the prior art is made to amplify intermediate frequency (I. F.) and audio frequency (A. F.) signals simultaneously, where a considerable frequency difference exists between the I. F. and the A. F. The operating characteristics of such an amplifier depend to a large extent upon the characteristics of the particular vacuum tube which is used, and also upon the volume control arrangement which is provided. The present invention incorporates important improvements into a reflex amplifier of this type.

One object of the invention is to provide an amplifier circuit including first and second amplifier tubes operating in cascade in amplifying an I. F. carrier signal, the second amplifier tube supplying the amplified I. F. signal to a detector circuit, and the detector circuit supplying both an automatic volume control voltage signal and an audio signal to the grids of both amplifier tubes simultaneously and in the same phase.

A further object of the invention is to provide an amplifier circuit utilizing a pair of vacuum tubes which are so arranged as to operate in cascade for amplifying an I. F. signal, and at the very same time to operate in parallel for amplifying an A. F. signal obtained from the I. F. signal through an associated detector and feedback loop.

The above and other objects of the invention will be more clearly apparent from the accompanying drawing in which my invention is illustrated by means of a schematic circuit diagram.

Referring now to the drawing, the novel circuit of my invention includes a pair of vacuum tube pentodes $V_4$ and $V_5$ which are so arranged as to operate in cascade for the purpose of I. F. amplification and, at the very same time, to operate in parallel for the purpose of A. F. amplification.

Transformers $T_1$, $T_2$ and $T_3$ are I. F. coupling transformers each having a 1:1 ratio. Primary winding 11 of transformer $T_1$ is connected to a pair of terminals representing input circuit No. 2, as will be subsequently explained. Secondary winding 12 of transformer $T_1$ has one end connected to control grid 23 of the tube $V_4$ while its other end is connected to a resistor $R_4$. Cathode 24 of tube $V_4$ is connected to ground through a bias resistor $R_5$ having a by-pass capacitor $C_2$ in parallel therewith. Primary winding 13 of transformer $T_2$ has one end connected to plate 21 of $V_4$ and its other end receiving direct current from an energizing source as will be explained. Secondary winding 14 of transformer $T_2$ has one end connected to control grid 33 of tube $V_5$ and its other end connected to a resistor $R_3$.

As indicated by the polarity markings, there is no inversion of an alternating voltage signal passing through transformer $T_2$ or $T_3$. That is, a positive signal applied to the upper end of the primary winding induces in the secondary winding a signal which is positive at the upper end of the winding and negative at the lower end.

The other ends of resistors $R_3$ and $R_4$ are connected to each other by means of a conductor 43 forming one terminal of input circuit No. 1, whose other terminal is connected to ground. Conductor 43 is connected to a resistor $R_2$ whose other end is connected to a conductor 42 representing the volume control voltage and A. F. feedback path. A capacitor $C_x$ shown connected by dotted lines between conductor 43 and ground does not form a part of the present circuit, but is illustrated in order to point out that the A. F. by-pass capacitor which is conventionally used is omitted in the circuit of the present invention.

Control grid 33 of tube $V_5$ is biased by means of a bias resistor $R_6$ which connects cathode 34 to ground, together with a by-pass capacitor $C_3$ in parallel with $R_6$. Suppressor grids 25 and 35 of tubes $V_4$ and $V_5$, respectively, are tied internally to the respective plates thereof.

Transformer $T_3$ has one end of its primary winding 15 connected to plate 31 of tube $V_5$ while the other end receives direct current from the power supply. Secondary winding 16 of transformer $T_3$ has one end connected to the anode of a rectifier D, a filter circuit comprising the parallel combination of a resistor $R_1$ and a capacitor $C_1$ being connected between the cathode of rectifier D and feedback conductor 42. The other end of winding 16 is also connected to conductor 42. A ground connection is made at the point of interconnection between diode D, capacitor $C_1$ and resistor $R_1$.

A terminal B+ represents the positive terminal of a power supply circuit or other source of direct energizing potential. An output transformer $T_4$ having two series connected primary windings 17 and 18 has also a secondary winding 19 representing output circuit No. 1. The end of winding 17 which is not connected to winding 18 represents one terminal of output circuit No. 2, whose other terminal is ground. The B+ terminal is connected to the junction between windings 17 and 18, and current flowing through winding 18 provides operating potentials for the plates and the screen grids of tubes $V_4$ and $V_5$, as will be described.

The other end of winding 18 is connected directly to the other end of winding 15 and is also connected through a resistor $R_7$ to the other end of winding 13. By-pass capacitor $C_4$ is connected between the positive end of winding 13 and ground while a by-pass capacitor $C_5$ in similar manner is connected between the positive end of winding 15 and ground. The junction point representing the common connection of resistor $R_7$, winding 18, capacitor $C_5$ and winding 15 is for convenience designated as 44. A resistor $R_8$ is connected between junction point 44 and another junction point identified as 41. Junction point 41 is by-passed directly to ground through a capacitor $C_7$. A resistor $R_9$ interconnects junction point 41 with screen grid 22 of tube $V_4$ for the purpose of supplying a bias potential thereto, and screen grid 22 is also by-passed to ground through a capacitor $C_6$. Screen grid 32 of tube $V_5$ is by-passed to ground through a capacitor $C_8$ and receives operating potential from a resistor $R_{10}$ connected to junction point 41.

In operation, input circuit No. 1 and output circuit No. 1 are used when it is desired to operate the radio set as a transmitter. An audio signal received from a microphone circuit or equivalent source is applied to input circuit No. 1, is amplified, and passes through output circuit No. 1 to the radio frequency power amplifier. During the receive operation input circuit No. 1 and output circuit No. 1 are not used and may be disconnected or otherwise rendered ineffectual.

When it is desired to operate the radio set as a receiver, a modulated I.-F. carrier is applied to input circuit No. 2 and the audio output signal appearing at output circuit No. 2 is used to drive a pair of head phones or equivalent load. Input circuit No. 2 and output circuit No. 2 are not used during the transmit operation and may be disconnected or otherwise rendered ineffectual.

Although the power supply terminal B+ is shown as a single terminal, it in fact is preferred to have two different values of operating voltage, one for transmit and the other for receive. By the same token it is not absolutely necessary to have two separate output circuits except on the assumption that the impedance and other circuit conditions are different for the transmit operation and the receive operation, which is generally the case.

Although it is to be understood that other circuit values may be used, a set of circuit values which have been found in actual usage to provide satisfactory operation of the circuit of the present invention are listed as follows:

| | |
|---|---|
| $T_1$, $T_2$, $T_3$ | All are 1:1 ratio I.-F. transformers having a powdered iron core, 5 turns per winding. |
| $T_4$ | All three windings are equal (each 5000 ohms); heavy iron core. |
| $V_4$, $V_5$ | Type 6AW8 (internally connected suppressor). |
| $R_1$ | 150K. |
| $R_2$ | 180K. |
| $R_3$, $R_4$ | 220K. |
| $R_5$, $R_6$ | 100K. |
| $R_7$, $R_8$, $R_9$, $R_{10}$ | 1K. |
| $C_1$ | 82 $\mu\mu$f. |
| $C_2$, $C_3$ | 0.01 $\mu$f. |
| $C_4$, $C_5$, $C_6$, $C_7$, $C_8$ | 0.001 $\mu$f=1000 $\mu\mu$f. |
| D | Crystal diode. |
| B+ | Transmit +300 volts; receive +150 volts. |
| I.-F. frequency | 10 megacycles. |
| A.-F. frequency | 50 to 4000 C. P. S. |

The circuit operation for the receive condition will now be briefly traced. A modulated I.-F. carrier wave supplied to input circuit No. 2 passes through transformer $T_1$ to control grid 23 of tube $V_4$. The amplified signal appears at plate 21 of tube $V_4$ and is applied through transformer $T_2$ to grid 33 of tube $V_5$. The further amplified signal appearing at plate 31 passes through transformer $T_3$ to the detector circuit where it is rectified and filtered. The time-constant of the filter circuit is of the order of 10 microseconds and hence eliminates the I.-F. but not the A.-F. Feedback conductor 42 therefore receives a varying direct voltage for regulating the bias on control grids 23 and 33, and for thus automatically controlling the volume of the amplified signal. Feedback conductor 42 also receives the A.-F. signal which, as previously pointed out, is not disposed of by $C_x$ or any equivalent by-pass capacitor. The A.-F. signal is amplified by tubes $V_4$ and $V_5$ operating in parallel and, through auto-transformer action, appears at output circuit No. 2. It should be noted that so long as the filtering action in the rectifier and filter circuit is sufficient for the I.-F. there is no appreciable difficulty with spurious oscillations due to feeding back the A.-F. signal, regardless of its phase relative to the I.-F. signal. Resistors $R_7$, $R_8$, $R_9$ and $R_{10}$ and capacitors $C_4$, $C_5$, $C_6$, $C_7$ and $C_8$ are included in the circuit, however, very largely for the purpose of eliminating undesirable oscillations as well as for the purpose of providing proper screen grid biasing.

During transmit the operation is much simpler. The audio signal applied to input circuit No. 1 is amplified by tubes $V_4$ and $V_5$ in parallel. The same signal is supplied to both grids, through $R_4$ and the secondary winding 12 of $T_1$ in the case of $V_4$, and through $R_3$ and the secondary winding 14 of $T_2$ in the case of $V_5$. The amplified signals appear in the output No. 1 windings of $T_4$.

Since the impedance of the I.-F. transformers $T_2$ and $T_3$ is approximately zero at audio frequencies, no appreciable voltage appears across secondary winding 16 of transformer $T_3$. Any feedback voltage generated on conductor 42, therefore, is small enough to be neglected.

With further reference to the receive operation, primary winding 18 of transformer $T_4$ presents to the I.-F. frequency a practically infinite impedance, whereas primary winding 15 of transformer $T_3$ presents to audio frequencies approximately zero impedance. Thus, in the amplifier circuit itself the amplification of the I.-F. and the A.-F. frequencies are carried on almost entirely independently of each other, while the feedback loop accepts only the I.-F. frequency as its driving signal and produces only the A.-F. signal (together with a slowly varying D. C. voltage for volume control) as its output signal.

Tubes $V_4$ and $V_5$ operate in normal pentode fashion for the purpose of I.-F. amplification, but operate substantially as triodes for audio amplification. One reason for this is that the screen grid by-passing provided by capacitors $C_6$ and $C_8$, adequate at I.-F. frequency, is wholly inadequate at the audio frequency resulting in screen grid degeneration and loss of amplification. Another reason is that resistors $R_7$, $R_8$, $R_9$ and $R_{10}$ are so small that the screen grids can be considered to be directly connected to the upper ends of primary windings 13 and 15 of transformers $T_2$ and $T_3$. Since these windings have approximately zero impedance at audio frequencies, the screen grids are for all intents and purposes directly connected to their respective plates.

The operation of the tubes substantially as triodes for audio frequencies is used to good advantage during the transmit operation, for the tubes then have a remote cut-off characteristic rather than a sharp cut-off as exhibited by the same tubes operating as pentodes. The remote cut-off characteristic causes the audio amplifier circuit to act very much like a compressor. Hence it is not necessary to regulate or restrict the amplitude range of the audio input signal. This is very advantageous in aircraft usage since considerable noise may be involved and the person speaking into the transmitting microphone is then permitted to shout if necessary in order to override the noise level.

Although my invention is fully capable of achieving the results and providing the advantages hereinbefore mentioned, it is to be understood that it is merely the presently preferred embodiment thereof, and that I do not mean to be limited to the details of construction above described other than as defined in the appended claims.

I claim:

1. A vacuum tube amplifier circuit comprising, in combination: first and second vacuum tubes each including a control grid, a cathode and a plate; first and second transformers having the respective primary windings thereof coupled to the plates of said first and second tubes, respectively; an output transformer having the primary winding thereof coupled to the other ends of the primary windings of said first and second transformers; means connected to the primary winding of said output transformer for supplying operating potential to both of said plates; a resistance-capacitance filter circuit connected to one end of the secondary winding of said second transformer; a rectifier element interconnecting said filter circuit with the other end of said secondary winding of said second transformer to provide a series loop circuit; input circuit means for supplying to the control grid of said first tube an intermediate frequency alternating voltage signal whose amplitude is modulated in accordance with an audio frequency envelope; means coupling the secondary winding of said first transformer to the control grid of said second tube; and feedback circuit means for coupling an audio feedback signal produced by said filter circuit to the control grids of both said first tube and said second tube simultaneously and in the same phase.

2. An amplifier circuit as claimed in claim 1 wherein said resistance-capacitance filter circuit has a time-constant of the order of 10 microseconds and in which said feedback circuit means is operable for passing audio frequency signals from said filter circuit to said grids substantially unattenuated.

3. An amplifier circuit as claimed in claim 2 wherein said feedback circuit means includes only a first resistor connected to said filter circuit, second and third resistors each having one end thereof connected to the other end of said first resistor, and means coupling the other ends of said second and third resistors to the grids of said first and second tubes, respectively.

4. A vacuum tube amplifier circuit utilizing a pair of vacuum tubes which are so arranged as to operate in cascade for amplifying an I.-F. signal, and at the very same time to operate in parallel for amplifying an A.-F. signal obtained from the I.-F. signal through an associated detector and feedback loop, or in the alternative to operate as an A.-F. amplifier only, said amplifier circuit comprising: first and second vacuum tubes each including a control grid, a cathode and a plate; first, second and third intermediate frequency transformers each having a primary winding and a secondary winding, each of said transformers exhibiting a substantial impedance at intermediate frequencies and approximately zero impedance at audio frequencies, one end of the secondary winding of said first transformer being coupled to the control grid of said first vacuum tube, one end of the primary winding of said second transformer being coupled to the plate of said first vacuum tube, one end of the secondary winding of said second transformer being connected to the control grid of said second vacuum tube, and one end of the primary winding of said third transformer being connected to the plate of said second vacuum tube; an audio output transformer having at least a primary winding; a point of fixed reference potential; a power supply terminal adapted to receive a direct voltage whose potential is positive with respect to said fixed reference potential, said primary winding of said audio transformer being coupled between said power supply terminal and the other ends of the primary windings of said second and third intermediate frequency transformers; first, second and third load resistors connected together at a common point, the other ends of said first and second load resistors being connected to the other ends of the secondary windings of said first and second intermediate frequency transformers, respectively; two separate biasing means associated with the cathodes of said first and second vacuum tubes, respectively; a diode interconnected between one end of the secondary winding of said third intermediate frequency transformer and said point of fixed reference potential; a resistor and a capacitor interconnected in parallel between the other end of the secondary winding of said third intermediate frequency transformer and said point of fixed reference potential, the product of the values of said resistor and said capacitor being of the order of $10^{-5}$, the other end of said third load resistor being also connected to said other end of said same secondary winding; means for applying an audio frequency input signal to said common point thereby to derive an amplified audio output signal from said audio output transformer; and means for applying a modulated intermediate frequency voltage signal to the primary winding of said first intermediate frequency transformer thereby to derive a detected and amplified audio output signal from said audio output transformer.

5. A vacuum tube amplifier as claimed in claim 4 in which each of said first and second vacuum tubes is a pentode having a screen grid and a suppressor grid, said suppressor grids being internally connected to their respective plates, and which additionally includes means for applying bias potential to said screen grids.

References Cited in the file of this patent

UNITED STATES PATENTS

| | | |
|---|---|---|
| 1,551,578 | Love | Sept. 1, 1925 |
| 1,672,037 | Parker | June 5, 1928 |
| 2,204,975 | Thierbach | June 18, 1940 |
| 2,512,300 | Braak | June 20, 1950 |